(12) United States Patent
Kim et al.

(10) Patent No.: US 6,874,662 B2
(45) Date of Patent: Apr. 5, 2005

(54) LIQUID CRYSTAL DISPENSING APPARATUS

(75) Inventors: Wan-Soo Kim, Gyeonggi-Do (KR); Hyug-Jin Kweon, Kyungsangbuk-Do (KR); Hae-Joon Son, Busan (KR)

(73) Assignee: LG. Philips LCD Co., Ltd., Seoul (KR)

(*) Notice: Subject to any disclaimer, the term of this patent is extended or adjusted under 35 U.S.C. 154(b) by 217 days.

(21) Appl. No.: 10/329,924

(22) Filed: Dec. 27, 2002

(65) Prior Publication Data

US 2003/0178447 A1 Sep. 25, 2003

(30) Foreign Application Priority Data

Mar. 21, 2002 (KR) .................................. 10-2002-15447
Mar. 21, 2002 (KR) .................................. 10-2002-15440

(51) Int. Cl.[7] .............................................. B65D 83/00
(52) U.S. Cl. .............................. 222/146.5; 222/181.1; 222/185.1; 222/399; 222/504
(58) Field of Search .......................... 222/146.2, 146.5, 222/181.1, 181.2, 181.3, 185.1, 394, 399, 373, 380, 131, 183, 504, 571; 239/103, 104, 470, 483, 490, 489, 533.12

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,653,864 A | 3/1987 | Baron et al. | |
| 4,691,995 A | 9/1987 | Yamazaki et al. | |
| 4,775,225 A | 10/1988 | Tsuboyama et al. | |
| 5,148,946 A | * 9/1992 | Mizuta et al. ................. | 222/1 |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,499,128 A | 3/1996 | Hasegawa et al. | |
| 5,507,323 A | 4/1996 | Abe | |
| 5,511,591 A | 4/1996 | Abe | |
| 5,539,545 A | 7/1996 | Shimizu et al. | |
| 5,548,429 A | 8/1996 | Tsujita | |
| 5,642,214 A | 6/1997 | Ishii et al. | |
| 5,680,189 A | 10/1997 | Shimizu et al. | |
| 5,742,370 A | 4/1998 | Kim et al. | |
| 5,747,102 A | * 5/1998 | Smith et al. ................. | 427/98.4 |
| 5,757,451 A | 5/1998 | Miyazaki et al. | |
| 5,852,484 A | 12/1998 | Inoue et al. | |
| 5,854,664 A | 12/1998 | Inoue et al. | |
| 5,861,932 A | 1/1999 | Inata et al. | |
| 5,875,922 A | 3/1999 | Chastine et al. | |
| 5,952,676 A | 9/1999 | Sato et al. | |
| 5,956,112 A | 9/1999 | Fujimori et al. | |
| 6,001,203 A | 12/1999 | Yamada et al. | |
| 6,011,609 A | 1/2000 | Kato et al. | |
| 6,016,178 A | 1/2000 | Kataoka et al. | |
| 6,016,181 A | 1/2000 | Shimada | |
| 6,055,035 A | 4/2000 | von Gutfeld et al. | |
| 6,163,357 A | 12/2000 | Nakamura | |
| 6,219,126 B1 | 4/2001 | Von Gutfeld | |
| 6,226,067 B1 | 5/2001 | Nishiguchi et al. | |

(Continued)

FOREIGN PATENT DOCUMENTS

EP 1 003 066 5/2000

(Continued)

*Primary Examiner*—Gene Mancene
*Assistant Examiner*—Patrick Buechner
(74) *Attorney, Agent, or Firm*—Morgan, Lewis & Bockius LLP (57) ABSTRACT

A liquid crystal dispensing apparatus includes a liquid crystal material container, a nozzle positioned at a lower portion of the liquid crystal container and having at least one groove formed at an exterior surface thereof, and a valve system for transmitting liquid crystal material from the liquid crystal material container to the nozzle by a gas pressure supplied to the liquid crystal material container.

24 Claims, 8 Drawing Sheets

U.S. PATENT DOCUMENTS

| | | | |
|---|---|---|---|
| 6,236,445 | B1 | 5/2001 | Foschaar et al. |
| 6,304,306 | B1 | 10/2001 | Shiomi et al. |
| 6,304,311 | B1 | 10/2001 | Egami et al. |
| 6,337,730 | B1 | 1/2002 | Ozaki et al. |
| 6,414,733 | B1 | 7/2002 | Ishikawa et al. |
| 2001/0021000 | A1 | 9/2001 | Egami |

FOREIGN PATENT DOCUMENTS

| | | |
|---|---|---|
| JP | 51-65656 | 6/1976 |
| JP | 57-38414 | 3/1982 |
| JP | 57-88428 | 6/1982 |
| JP | 58-27126 | 2/1983 |
| JP | 59-57221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-7822 | 1/1986 |
| JP | 61-55625 | 3/1986 |
| JP | 62-89025 | 4/1987 |
| JP | 62-90622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 5-127179 | 5/1993 |
| JP | 5-154923 | 6/1993 |
| JP | 5-265011 | 10/1993 |
| JP | 5-281557 | 10/1993 |
| JP | 5-281562 | 10/1993 |
| JP | 6-51256 | 2/1994 |
| JP | 6-148657 | 5/1994 |
| JP | 6-160871 | 6/1994 |
| JP | 6-235925 | 8/1994 |
| JP | 6-265915 | 9/1994 |
| JP | 6-313870 | 11/1994 |
| JP | 7-84268 | 3/1995 |
| JP | 7-128674 | 5/1995 |
| JP | 7-181507 | 7/1995 |
| JP | 8-95066 | 4/1996 |
| JP | 8-101395 | 4/1996 |
| JP | 8-106101 | 4/1996 |
| JP | 8-171094 | 7/1996 |
| JP | 8-190099 | 7/1996 |
| JP | 8-240807 | 9/1996 |
| JP | 9-5762 | 1/1997 |
| JP | 9-26578 | 1/1997 |
| JP | 9-61829 | 3/1997 |
| JP | 9-73075 | 3/1997 |
| JP | 9-73096 | 3/1997 |
| JP | 9-127528 | 5/1997 |
| JP | 9-230357 | 9/1997 |
| JP | 9-281511 | 10/1997 |
| JP | 9-311340 | 12/1997 |
| JP | 10-123537 | 5/1998 |
| JP | 10-123538 | 5/1998 |
| JP | 10-142616 | 5/1998 |
| JP | 10-177178 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-14953 | 1/1999 |
| JP | 11-38424 | 2/1999 |
| JP | 11-68411 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | 11-326922 | 11/1999 |
| JP | 11-344714 | 12/1999 |
| JP | 2000-2879 | 1/2000 |
| JP | 2000-29035 | 1/2000 |
| JP | 2000-56311 | 2/2000 |
| JP | 2000-66165 | 3/2000 |
| JP | 2000-137235 | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-5401 | 1/2001 |
| JP | 2001-5405 | 1/2001 |
| JP | 2001-13506 | 1/2001 |
| JP | 2001-33793 | 2/2001 |
| JP | 2001-42341 | 2/2001 |
| JP | 2001-51284 | 2/2001 |
| JP | 2001-66615 | 3/2001 |
| JP | 2001-91727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |
| JP | 2001-183683 | 7/2001 |
| JP | 2001-201750 | 7/2001 |
| JP | 2001-209052 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |
| JP | 2001-264782 | 9/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |
| JP | 2001-356354 | 10/2001 |
| JP | 2001-330837 | 11/2001 |
| JP | 2001-330840 | 11/2001 |
| JP | 2001-356353 | 12/2001 |
| JP | 2002-14360 | 1/2002 |
| JP | 2002-23176 | 1/2002 |
| JP | 2002-49045 | 2/2002 |
| JP | 2002-82340 | 3/2002 |
| JP | 2002-90759 | 3/2002 |
| JP | 2002-90760 | 3/2002 |
| JP | 2002-107740 | 4/2002 |
| JP | 2002-122872 | 4/2002 |
| JP | 2002-122873 | 4/2002 |
| JP | 2002-139734 | 5/2002 |
| JP | 2002-202512 | 7/2002 |
| JP | 2002-202514 | 7/2002 |
| JP | 2002-214626 | 7/2002 |
| KR | 2000-0035302 | 6/2000 |

* cited by examiner

LIQUID CRYSTAL DISPENSING APPARATUS

The present invention claims the benefit of Korean Patent Application Nos. 15440/2002 and 15447/2002 both filed in Korea on Mar. 21, 2002, which are hereby incorporated by reference.

BACKGROUND OF THE INVENTION

1. Field of the Invention

The present invention relates to a liquid crystal dispensing apparatus, and in particular, to a liquid crystal dispensing apparatus capable of dispensing an accurate amount of liquid crystal onto a substrate and distributing the dispensed liquid crystal onto the substrate.

2. Description of the Related Art

Currently, the development of various portable electronic equipment, such as mobile phones, personal digital assistants (PDAs), and notebook computers, require flat panel display devices having light weight, small size, and adaptability to portable electronic equipment. Various different types of flat panel display devices have been developed for these portable electronic equipment including liquid crystal displays (LCDs), plasma display panels (PDP), field emission displays (FEDs), and vacuum fluorescent displays (VFDs).

Figure 1:
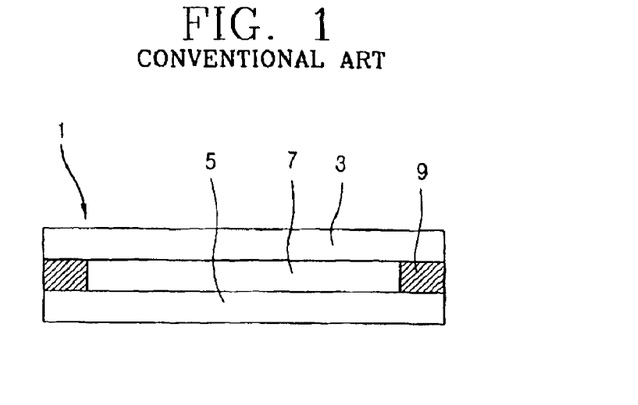
FIG. 1 is a cross sectional view of a liquid crystal display device according to the related art.

FIG. 1 is a cross sectional view of a liquid crystal display device according to the related art. In FIG. 1, an LCD 1 includes a lower substrate 5, an upper substrate 3, and liquid crystal material layer 7 arranged between the lower substrate 5 and the upper substrate 3. The lower substrate 5 is a driving element array substrate having a plurality of pixel regions formed on an inner surface thereof. A driving element, such as a TFT (thin film transistor), is formed within each of the pixel regions. The upper substrate 3 is a color filter substrate, and includes a color filter layer formed on an inner surface thereof for producing colored light. In addition, a pixel electrode and a common electrode are formed on the lower substrate 5 and the upper substrate 3, respectively, and an alignment layer for aligning liquid crystal molecules of the liquid crystal material layer 7 is coated on the lower substrate 5 and the upper substrate 3.

The lower substrate 5 and the upper substrate 3 are bonded to each other by a sealing material 9, and the liquid crystal material layer 7 is disposed therebetween. Accordingly, information is displayed by controlling an amount of light transmitted through the liquid crystal material layer 7 by driving the liquid crystal molecules with the driving element formed on the lower substrate 5.

A fabrication process of a liquid crystal display device can be divided into a driving element array substrate process for forming a driving element on the lower substrate 5, a color filter substrate process for forming a color filter on the upper substrate 3, and a cell formation process.

Figure 2:
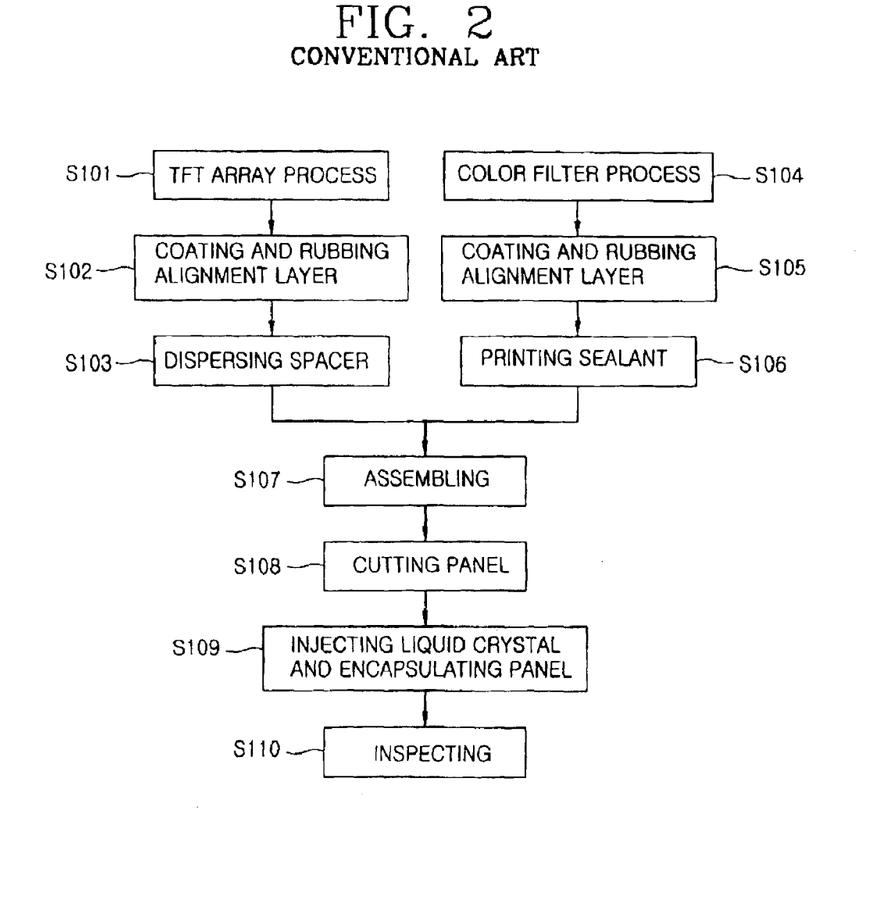
FIG. 2 is a flow chart of a liquid crystal display device fabrication method for forming the liquid crystal display device of FIG. 1 according to the related art.

FIG. 2 is a flow chart of a liquid crystal display device fabrication method for forming the liquid crystal display device of FIG. 1 according to the related art. In step S101, a TFT array process is performed to include a plurality of gate lines and data lines (not shown) arranged on the lower substrate 5, thereby defining a plurality of pixel regions. In addition, a TFT is connected to the gate and data lines formed within each of the pixel regions to function as a driving element. Furthermore, a pixel electrode that contacts the TFT and drives the liquid crystal material layer 7 according to a signal applied through the TFT is formed by the driving element array process.

In step S104, red, green, and blue color filter layers and a common electrode are formed on the upper substrate 3 by the color filter process to generate colored light.

In step S102, a coating process includes forming an alignment layer on the lower substrate 3 to induce a surface anchoring (i.e., a pretilt angle and an alignment direction) to liquid crystal molecules of a liquid crystal material layer 7 formed between the upper and lower substrates 3 and 5. Then, the alignment layer formed on the lower substrate 3 is rubbed.

In step S105, an additional coating process includes forming an alignment layer on the upper substrate 5 to induce a surface anchoring (i.e., a pretilt angle and an alignment direction) to liquid crystal molecules of a liquid crystal material layer 7 formed between the upper and lower substrates 3 and 5. Then, the alignment layer formed on the upper substrate 5 is rubbed.

In step S103, spacers are uniformly dispersed on the lower substrate 5 to maintain a uniform cell gap between the upper and lower substrates 3 and 5.

In step S106, a sealing material 9 is coated onto the upper substrate 3.

In step S107, the upper and lower substrates 3 and 5 are bonded together under pressure.

In step S108, the bonded upper and lower substrates 3 and 5 are cut and processed to form a plurality of individual liquid crystal display cells.

In step S109, liquid crystal material is injected into each of the individual liquid crystal display cells via a liquid crystal injection hole. Then, each of the individual liquid crystal display cells is encapsulated.

In step S110, each of the encapsulated individual liquid crystal display cells is inspected.

Figure 3:
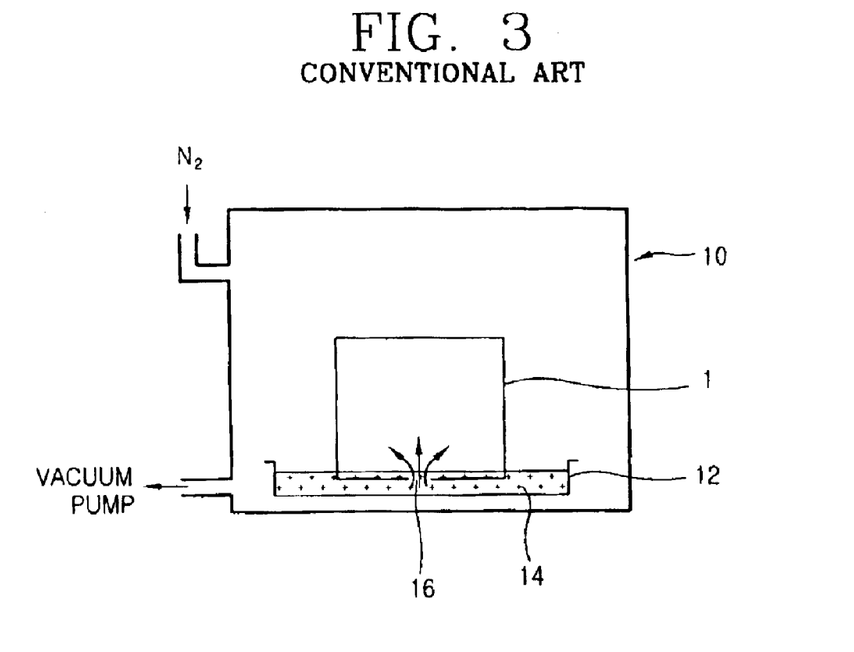
FIG. 3 is a cross sectional view of a liquid crystal injecting apparatus according to the related art.

FIG. 3 is a cross sectional view of a liquid crystal injecting apparatus according to the related art; In FIG. 3, a container 12 containing liquid crystal material 14 is disposed within a vacuum chamber 10, and a liquid crystal panel 1 is placed above the container 12. In addition, a liquid crystal panel mover (not shown) is disposed within the vacuum chamber 10 to move the liquid crystal panel 1 into the container 12, thereby making contact between the liquid crystal material 14 and a liquid crystal injection hole 16 of the liquid crystal panel 1. In general, this method is commonly referred to as a liquid crystal dipping injection method.

Then, the pressure within the vacuum chamber 10 is increased by supplying nitrogen ($N_2$) gas into the interior of the vacuum chamber 10. Accordingly, the liquid crystal material 14 is injected into the liquid crystal panel 1 through the liquid crystal injection hole 16 due to a pressure difference between the liquid crystal panel 1 and the vacuum chamber 10. Then, after the liquid crystal material 14 completely fills the liquid crystal panel 1, the liquid crystal injection hole 16 is sealed by a sealing material and a liquid crystal material layer is formed inside of the liquid crystal panel 1. In general, this method is commonly referred to as a liquid crystal vacuum injection method.

However, the liquid crystal vacuum injection method is problematic. First, a total processing time for completely injecting the liquid crystal material 14 into the liquid crystal panel 1 through the liquid crystal injection hole 16 requires a significant amount of time. Generally, since an interval between the driving element array substrate (i.e., lower substrate 5 in FIG. 1) and the color filter substrate (i.e., upper substrate 3 in FIG. 1) of the liquid crystal panel 1 is about a few $\mu$m, a very small amount of liquid crystal material 14 per unit time is injected into the liquid crystal panel 1. For example, during fabrication of a 15 inch liquid crystal panel, total processing time for completely injecting the liquid crystal material 14 into the liquid crystal panel 1 may be 8 hours. Accordingly, fabrication efficiency of the liquid crystal panel 1 is low.

Second, a liquid crystal material consumption rate is very high. Compared to the amount of the liquid crystal material 14 placed into the container 12, the amount of liquid crystal material 14 actually injected into the liquid crystal panel 1 is very small. Moreover, when the liquid crystal material 14 is exposed to the atmosphere air or to certain gases, the liquid crystal material deteriorates. Furthermore, the liquid crystal material 14 deteriorates by the flow of impurities during contact with the liquid crystal panel 1. Thus, any of the liquid crystal material 14 that remains in the container 12 after injection into each liquid crystal panel 1 must be discarded. Accordingly, productions costs are increased.

SUMMARY OF THE INVENTION

Accordingly, the present invention is directed to a liquid crystal dispensing apparatus that substantially obviates one or more of the problems due to limitations and disadvantages of the related art.

An object of the present invention is to provide a liquid crystal dispensing apparatus capable of cleanly dispensing liquid crystal material directly onto substrates of a liquid crystal display panel.

Another object of the present invention is to provide a liquid crystal dispensing apparatus capable of improving a liquid crystal material dispensing accuracy on substrates of a liquid crystal display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal dispensing apparatus includes a liquid crystal material container, a nozzle positioned at a lower portion of the liquid crystal container and having at least one groove formed at an exterior surface thereof, and a valve system for transmitting liquid crystal material from the liquid crystal material container to the nozzle by a gas pressure supplied to the liquid crystal material container.

In another aspect, a liquid crystal dispensing apparatus includes a liquid crystal material container, a heating system for heating liquid crystal material within the liquid crystal material container, a nozzle positioned at a lower portion of the liquid crystal material container for dispensing the liquid crystal material onto a surface of a substrate, and a valve system for controlling flow of the liquid crystal material from the liquid crystal material container to the nozzle by application of gas pressure into the liquid crystal material container.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
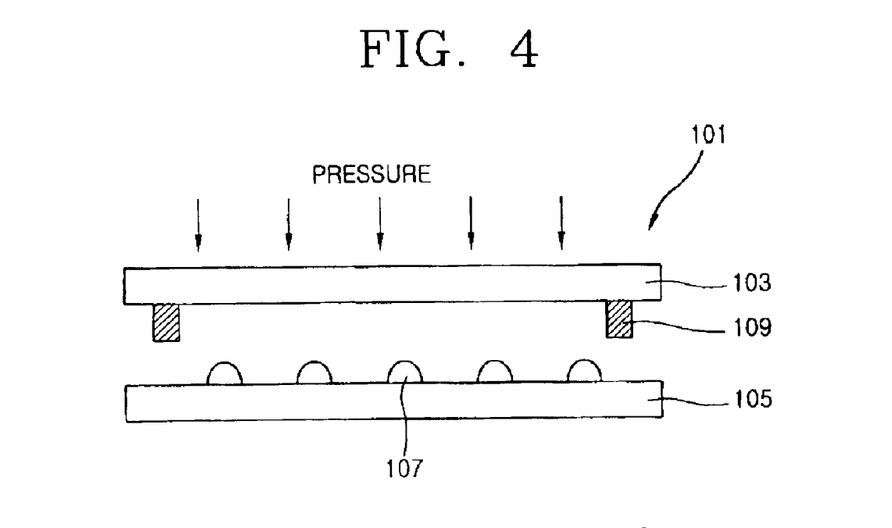
FIG. 4 is a cross sectional view of a liquid crystal display device fabricated by an exemplary liquid crystal dispensing method in accordance with the present invention.

FIG. 4 is a cross sectional view of a liquid crystal display device fabricated by an exemplary liquid crystal dispensing method in accordance with the present invention. In FIG. 4, before a lower substrate 105 having a plurality of driving elements (i.e. TFT substrate) and an upper 103 having a plurality of color filters (i.e., CF substrate) are bonded together, liquid crystal material 107 may be dispensed onto a surface of the lower substrate 105 having the driving elements as a serial of drops spaced at uniform intervals. Alternatively, or in addition to, the liquid crystal 107 may be dispensed onto a surface of the upper substrate 103 having the color filters. In addition, a sealing pattern 109 may be formed along an outer perimeter of the lower substrate. Alternatively, the sealing pattern may be formed along a perimeter of the lower substrate 105. Moreover, the sealing pattern 109 may be formed on both the upper and lower substrates 103 and 105. Furthermore, the sealing pattern 109 may include a plurality of concentric columns formed on the perimeter of the upper and/or lower substrates 103 and 105. During the liquid crystal dispensing method, any one of the TFT substrate and the CF substrate can be an object upon which the liquid crystal material 107 may be dispensed. However, which ever of the upper and lower substrates 103 and 105 is to receive the liquid crystal material 107 should be positioned as the lower substrate. Alternatively, depending on a viscosity of the liquid crystal material 107, the liquid crystal material 107 may be dispensed on the upper and/or lower substrates 103 and 105.

Next, the upper and lower substrates 103 and 105 may be aligned with each and bonded together. Accordingly, the liquid crystal material 107 may flow between the upper and lower substrates 103 and 105 by application of pressure to the upper and lower substrates 103 and 105. Thus, a uniform thickness of the liquid crystal material layer may be formed between the upper and lower substrates 103 and 105.

Figure 5:
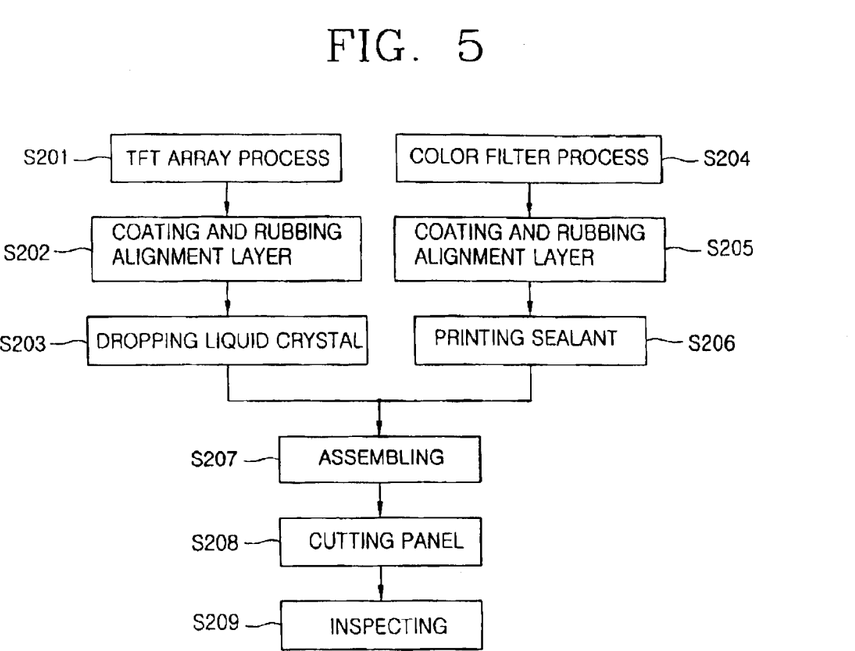
FIG. 5 is a flow chart of an exemplary fabrication process of a liquid crystal display device in accordance with the present invention.

FIG. 5 is a flow chart of an exemplary fabrication process of the liquid crystal display device of FIG. 4 in accordance with the present invention. In FIGS. 4 and 5, a step S201 may include forming a TFT array on the lower substrate 105 during a TFT array process, and a step S204 may include forming a color filter layer on the upper substrate 103 during a color filter process.

In a step S202, an alignment layer may be coated onto the lower substrate 105 having the TFT array. Next, a rubbing process may be performed on the alignment layer coated on the lower substrate 105.

In a step S205, another alignment layer may be coated onto the upper substrate 103 having the color filter layer. Next, a rubbing process may be performed upon the alignment layer on the upper substrate 103.

In a step S203, liquid crystal material may be dropped onto a surface of the lower substrate 105 having the TFT array at equal intervals. Alternatively, the liquid crystal material may be dropped onto the surface of the lower substrate 105 at groups of equal first intervals, wherein the groups are spaced apart by second intervals unequal to the first intervals to accommodate large substrates having a plurality of individual display panel regions.

In a step S206, the sealant pattern 109 may be formed by coating a sealant material or sealant materials along a perimeter of the upper substrate 103. Alternatively, the sealant pattern 109 may include a plurality of sealant patterns formed in a plurality of regions on the upper substrate 103 to accommodate large substrates having a plurality of individual display panel regions. Moreover, the sealant pattern 109 may be formed on both the upper and lower substrates. In addition, the sealant pattern 109 may include a plurality of sealant patterns formed concentrically around the upper substrate 103, or concentrically around each of the plurality of individual display panel regions.

In a step S07, the upper and lower substrates 103 and 105 may be aligned and bonded together by application of pressure upon the upper substrate 103 and the lower substrate 105. Accordingly, the sealing pattern 109 formed the upper substrate 105 and/or the lower substrate 103 may mechanically bond the upper and lower substrates 103 and 105 together. During the application of pressure, the liquid crystal material 107 may flow uniformly along an entire width of the bonded upper and lower substrates 103 and 105. Alternatively, the liquid crystal material 107 may flow uniformly within each of the individual display panel regions.

In a step S208, the bonded upper and lower substrates 103 and 105 may be divided into a plurality of individual display panel cells corresponding to the plurality of display panel regions. During the step S208, the plurality of individual display panel cells may be formed using a cutting tool to scribe a line across an outer surface of one of the upper and lower substrates 103 and 105. Alternatively, outer surfaces of both the upper and lower substrates 103 and 105 may be scribed with a line.

In a step S209, each of the individual display panel cells may be inspected for defects. For example, each of the individual display panel cells may be held up to light to ensure even distribution of the liquid crystal material 107 between the upper and lower substrates 103 and 105. In addition, surface defects of the bonded upper and lower substrates 103 and 105 may be performed. Alternatively, or in addition to the step S209, the inspection process may be performed prior to the dividing of the individual liquid crystal display cells.

During the above-described fabrication process, positioning for dispensing the liquid crystal material and a dispensing amount of the liquid crystal material may be critical in forming a liquid crystal material layer of a precise thickness. In particular, since a thickness of the liquid crystal material layer may be directly related to a cell gap of the liquid crystal panel, an accurate liquid crystal dispensing position and dispensing amount may be important factors for preventing formation of defects in the liquid crystal panel. Accordingly, an apparatus for dispensing a precise amount of liquid crystal material at an accurate position may be required.

Figure 6:
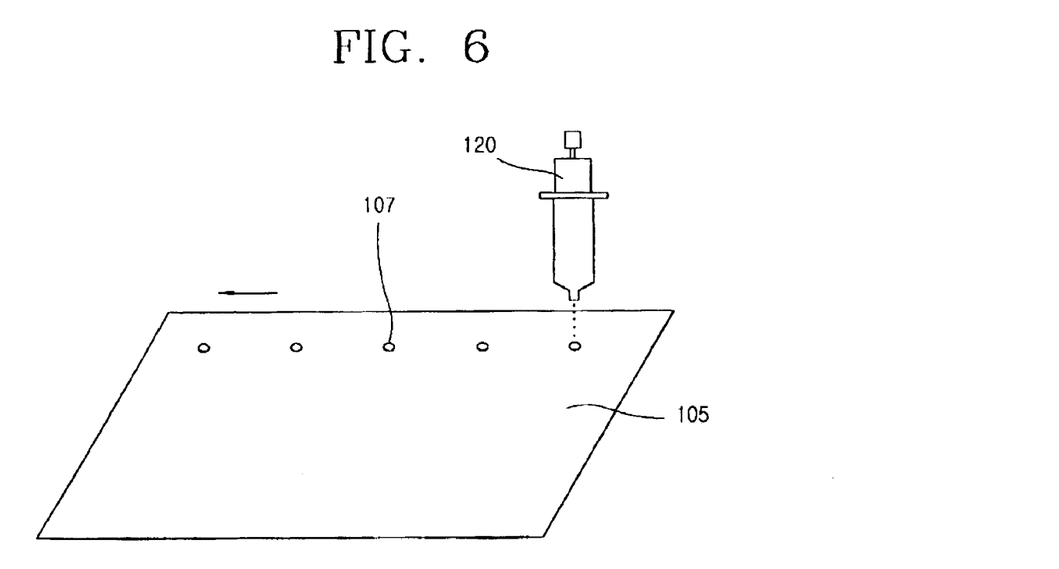
FIG. 6 is a perspective view of an exemplary liquid crystal dispensing method in accordance with the present invention.

FIG. 6 is a perspective view of an exemplary liquid crystal dispensing method in accordance with the present invention. In FIG. 6, a liquid crystal dispensing apparatus 120 may be installed above a substrate 105. The liquid crystal dispensing apparatus 120 may be filled with liquid crystal material 107 to dispense a specific amount of the liquid crystal material 107 onto the substrate 105. The liquid crystal material 107 may be dispensed onto the substrate 105 as a drop shape.

Next, the substrate 105 may be moved along both X-axis and Y-axis directions at a constant rate, and the liquid crystal dispensing apparatus 120 may remain stationary to discharge the liquid crystal material 107 at specific time intervals. Accordingly, the liquid crystal material 107 may be dispensed onto the substrate 105 at regular intervals along the X-axis and Y-axis directions. Alternatively, the substrate 105 may remain stationary and the liquid crystal dispensing apparatus 120 may be moved along the X-axis and Y-axis directions to dispense the liquid crystal material 107 onto the substrate 105 at regular intervals. Moreover, both the substrate 105 and the liquid crystal dispensing apparatus 120 may be moved along the X-axis and Y-axis directions to dispense the liquid crystal material 107 onto the substrate 105 at regular intervals. However, it may be preferable to keep the liquid crystal dispensing apparatus 120 stationary and move the substrate 105 along the X-axis and Y-axis directions.

Alternatively, the liquid crystal material 107 may be dropped onto the surface of the substrate 105 at groups of equal first intervals, wherein the groups are spaced apart by second intervals unequal to the first intervals to accommodate large substrates having a plurality of individual display panel regions. Accordingly, the liquid crystal material 107 may be dropped onto the surface of the substrate 105 in almost any interval geometry.

Figure 7A:
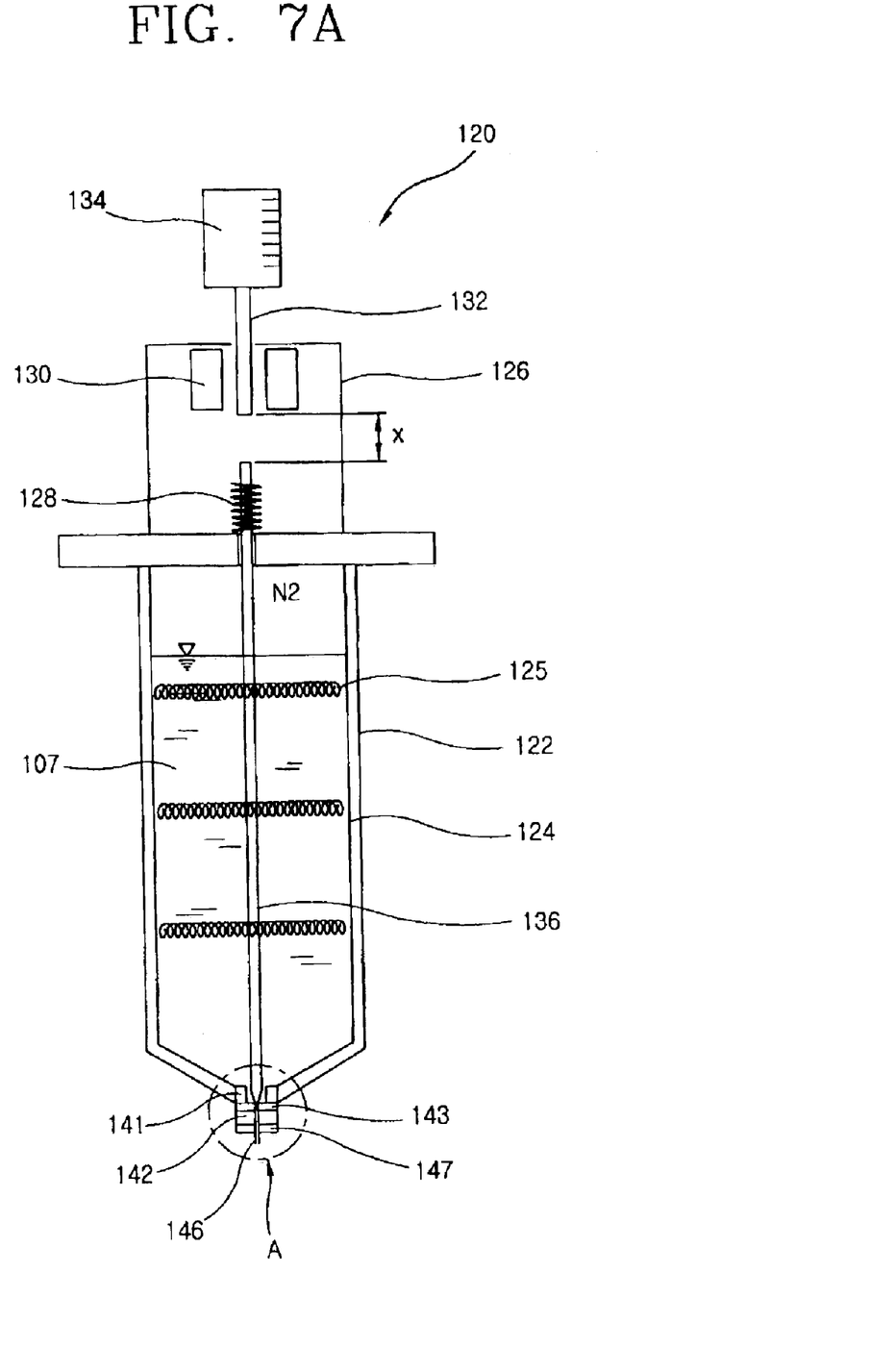
FIG. 7A is a cross sectional view of an exemplary liquid crystal dispensing apparatus prior to injecting of liquid crystal material in accordance with the present invention.
Figure 7B:
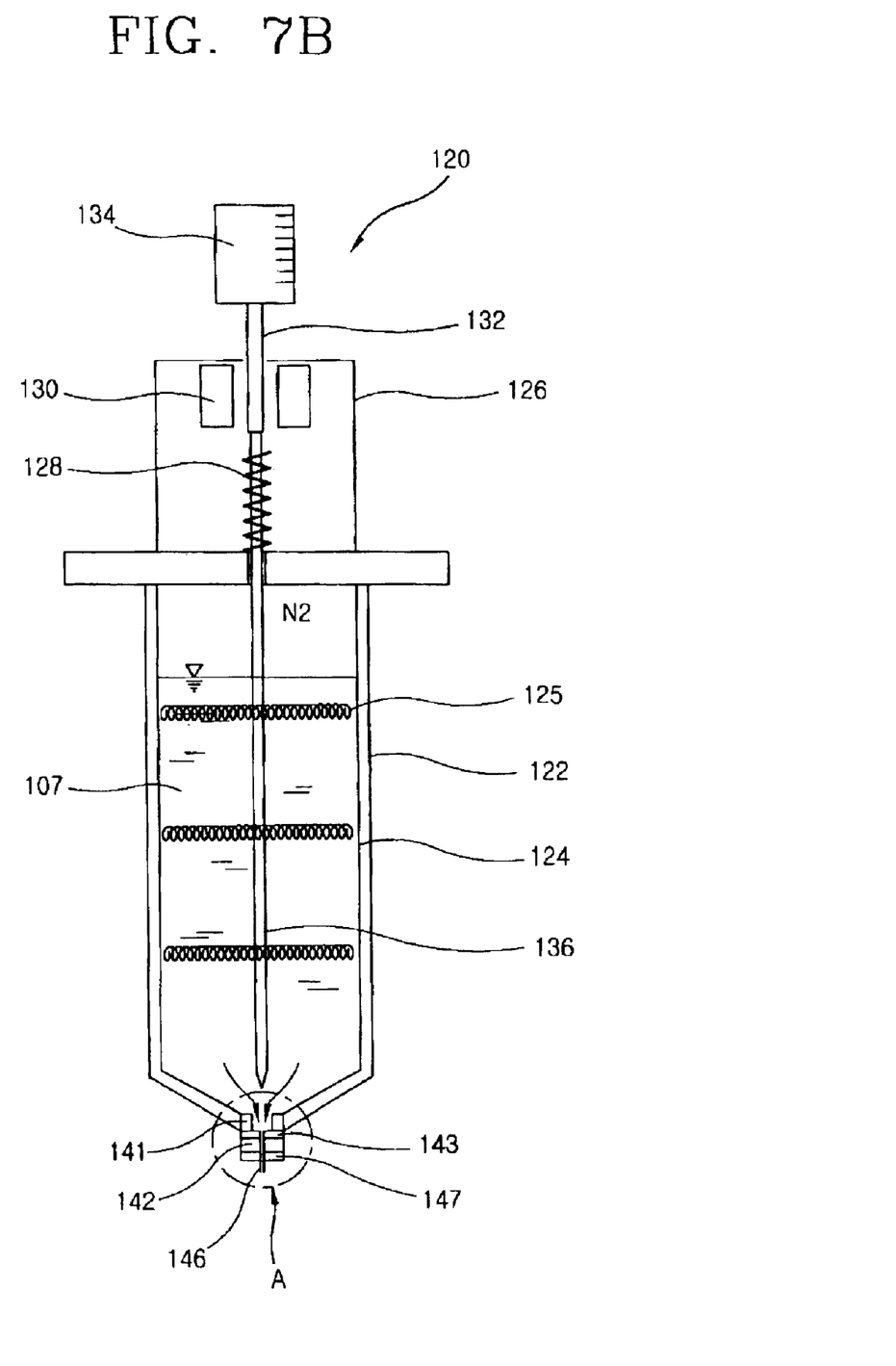
FIG. 7B is a cross sectional view of the exemplary liquid crystal dispensing apparatus during injection of liquid crystal material in accordance with the present invention.
Figure 8:
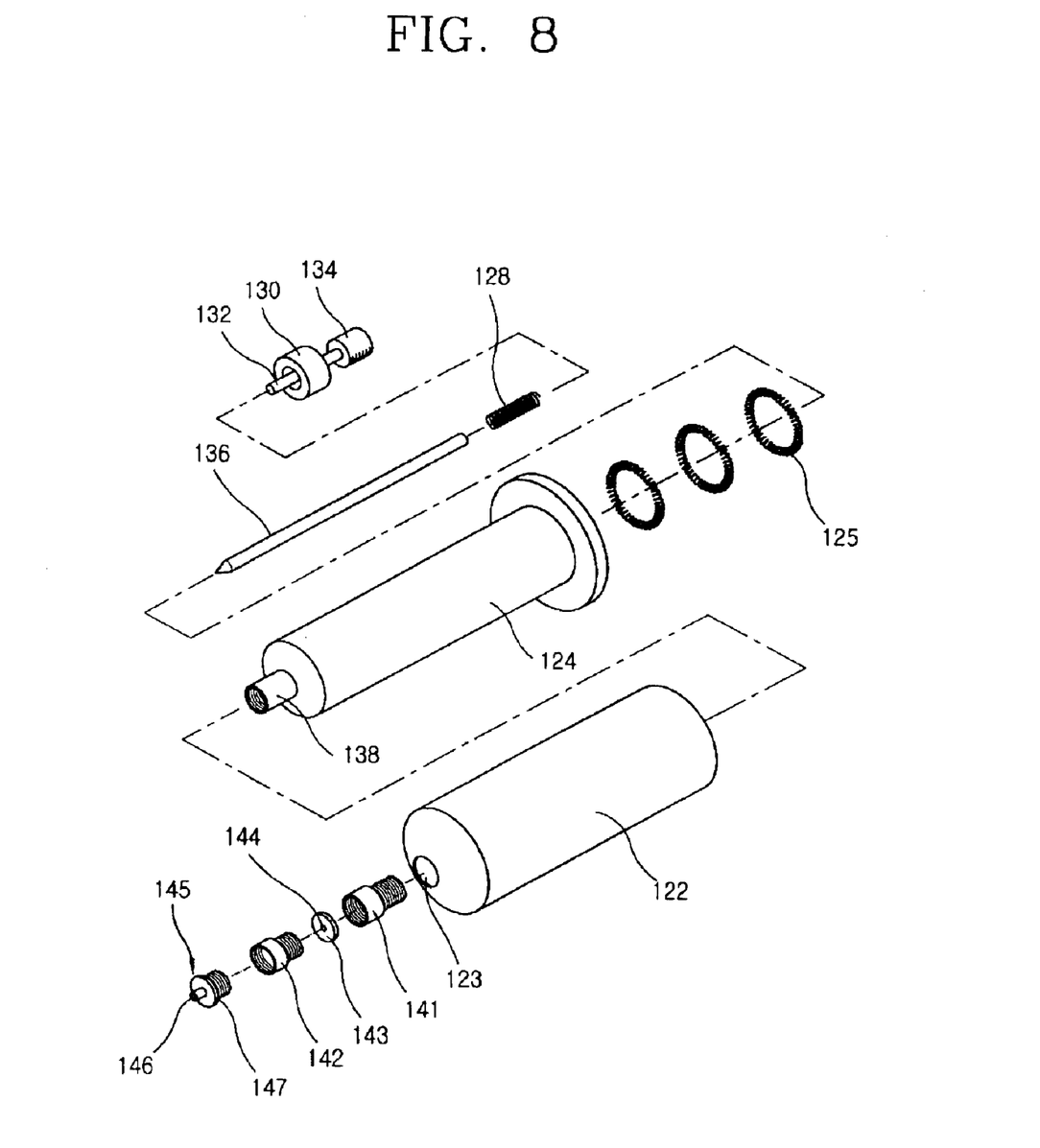
FIG. 8 is a perspective assembly view of the exemplary liquid crystal dispensing apparatus of FIGS. 7A and 7B in accordance with the present invention.

FIG. 7A is a cross sectional view of an exemplary liquid crystal dispensing apparatus prior to injecting of liquid crystal material in accordance with the present invention, FIG. 7B is a cross sectional view of the exemplary liquid crystal dispensing apparatus during injection of liquid crystal material in accordance with the present invention, and FIG. 8 is a perspective assembly view of the exemplary liquid crystal dispensing apparatus of FIGS. 7A and 7B in accordance with the present invention.

In FIGS. 7A, 7B, and 8, a liquid crystal dispensing apparatus 120 may include a cylindrical liquid crystal container 124 disposed within a casing 122, wherein the liquid crystal container 124 may be made of polyethylene and may be filled with liquid crystal material 107. The casing 122 may be made of stainless steel to receive the liquid crystal container 124. Accordingly, since polyethylene is a material having good processability, it may be easily fabricated into a specific shapes. In addition, since polyethylene does not necessarily react with the liquid crystal material 107, it may be used as material for forming the liquid crystal container 124. However, polyethylene has low strength and may be easily deformed by weak external impact. In particular, when the liquid crystal container 124 is made of polyethylene and is deformed, the liquid crystal material 107 may not be accurately dispensed onto a surface of a substrate. Accordingly, the liquid crystal container 124 may be disposed within the casing 122 made of stainless steel having a strength higher than that of polyethylene. A gas supply pipe (not shown) may be connected to an external gas supply unit (not shown) installed above the liquid crystal container 124. Gas, such as nitrogen, may be supplied from the external gas supply unit (not shown) to the liquid crystal container 124 through the gas supply pipe (not shown). Accordingly, the gas may fill a region of the liquid crystal container 124 not filled with the liquid crystal material 107 and exert a pressure onto the liquid crystal material 107 so as to dispense the liquid crystal material.

Alternatively, the liquid crystal container 124 may be made of stainless steel. Accordingly, the casing 122 may not be necessary such that production costs of the liquid crystal dispensing apparatus 120 may be reduced. As described above, when the liquid crystal container 124 is made of a metal it is preferable to coat internal surfaces of the liquid crystal container 124 with a fluorine resin layer in order to prevent the liquid crystal material 107 from reacting with the container 124.

In addition, a heating system 125 may be positioned inside the liquid crystal container 124. The heating system 125 may include, or be connected to an external power supply system (not shown). Accordingly, the heating system 125 may provide heat to the liquid crystal material 107 within the liquid crystal container 124. Heating the liquid crystal material 107 within the liquid crystal container 124 will be now be explained.

Since ferroelectric liquid crystal material is several hundred times faster than twisted neumatic (TN) liquid crystal material, it may be used for a large scale, high density reflective portable displays. However, the ferroelectric liquid crystal material has high viscosity characteristics in comparison with the TN liquid crystal material. Accordingly, when the ferroelectric liquid crystal material is dispensed onto the substrate at room temperature with the liquid crystal dispensing apparatus 120 in accordance with the present invention, accurate dispensing of the ferroelectric liquid crystal material may not be adequate. However, by adopting a system for heating the liquid crystal material 107 within the liquid crystal container 124, it may be possible to accurately dispense the ferroelectric liquid crystal material onto a surface of a substrate by decrease the viscosity of the ferroelectric liquid crystal material. In addition, the heating system may provide for improved flow of the ferroelectric liquid crystal material between upper and lower bonded substrates during application of pressure, as detailed above.

However, the liquid crystal dispensing apparatus in accordance with the present invention is not limited to use of ferroelectric liquid crystal materials. When the liquid crystal dispensing apparatus having the heating system in accordance with the present invention is used, viscosity of the liquid crystal material may be lowered. Accordingly, the present invention may be applicable for use with liquid crystal materials that may desirable for use in liquid crystal display devices but may be difficult to accurately dispense onto a surface of a substrate at room temperature.

In FIGS. 7A, 7B, and 8, the heating system 125 may include a coil or coils positioned at an interior the liquid crystal container 124, whereby power supplied from the external power supply system (not shown) may heat the liquid crystal material 107. Alternatively, the heating system may include a pipe connected to an external pumping system for moving a warm fluid, such as air or liquid, through the pipe to heat the liquid crystal material 107.

Figure 9:
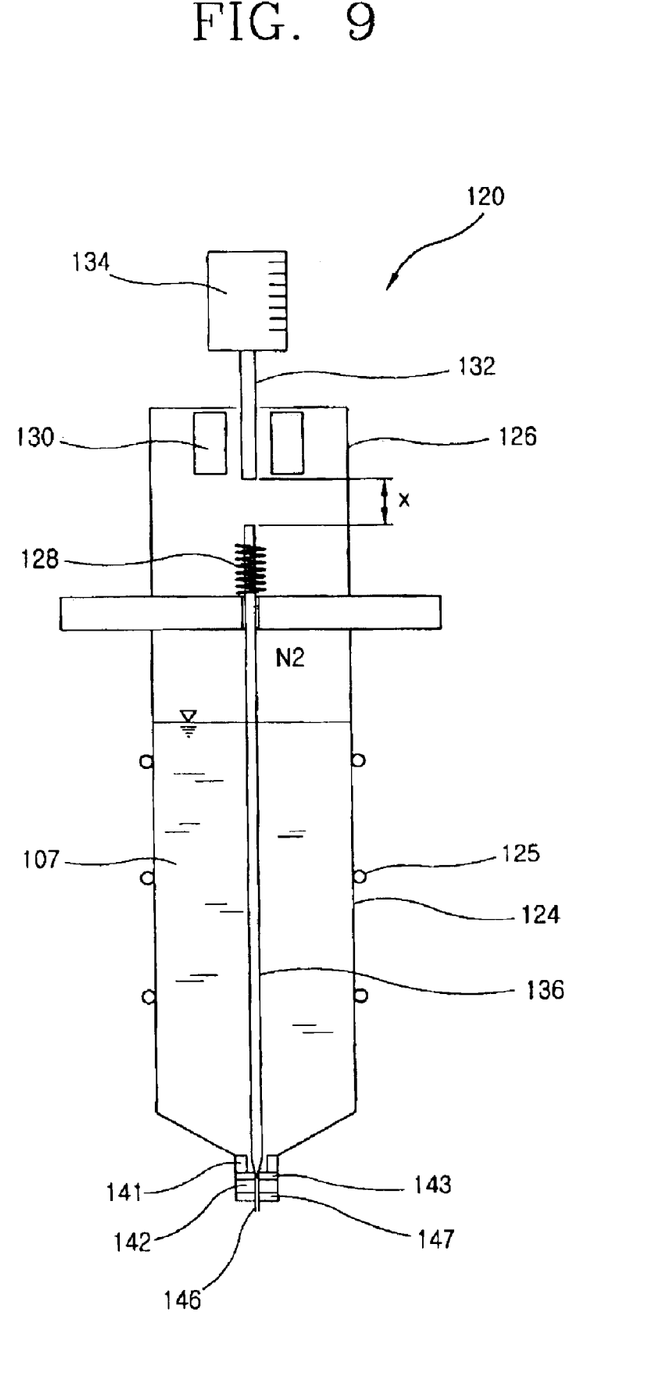
FIG. 9 is a cross sectional view of another exemplary liquid crystal dispensing apparatus including a heating system installed along an outer surface in accordance with the present invention.

FIG. 9 is a cross sectional view of another exemplary liquid crystal dispensing apparatus including a heating system installed along an outer surface in accordance with the present invention. In FIG. 9, a heating system 125 may be positioned at an exterior of a liquid crystal container 124 to heat the liquid crystal container 124. Accordingly, liquid crystal 107 within the liquid crystal container 124 may be heated. It may be preferable for the liquid crystal container 124 to be made of stainless steel without forming a casing 122 (in FIGS. 7A, 7B, and 8). For example, if the liquid crystal container 124 were to be disposed within the casing 122, the heating system 125 would be positioned at the exterior of the cassing and could not directly heat the liquid crystal container 124. Thus, a heating efficiency of the heating system 125 would be relatively low.

In addition, since viscosity of the liquid crystal material 107 is dependent upon the temperature of the liquid crystal material 107, the amount of heat supplied to the liquid crystal material 107 must be controlled. In general, most nematic liquid crystal materials used for liquid crystal display devices maintain a liquid phase at room temperature. Accordingly, the heating system 125 may maintaining a temperature of the liquid crystal material 107 at room temperature.

In FIG. 8, an opening 123 may be formed at a lower end of the casing 122. When the liquid crystal container 124 is disposed within the casing 122, an internally threaded protrusion 138 may be formed at a lower end of the liquid crystal container 124 to be inserted into the opening 123 to combine the liquid crystal container 124 with the casing 122. In addition, the protrusion 138 may be combined with an externally threaded portion of a first combining unit 141.

In addition, the first combining unit 141 may include an internally threaded portion that may be combined with an externally threaded portion of a second combining unit 142. A needle seat 143 may be positioned between the first combining unit 141 and the second combining unit 142 to be seated between the internally threaded portion of the first combining unit 141 and the externally threaded portion of the second combining unit 142. The needle seat 143 may include a discharge hole 144, wherein the liquid crystal material 107 within the liquid crystal container 124 may be discharged through the discharge hole 144 after flowing through the second combining unit 142.

In addition, a nozzle 145 may be combined with the second combining unit 142 for dispensing a precise amount of the liquid crystal material 107 within the liquid crystal container 124. The nozzle 145 may include an externally threaded portion that may be combined with an internally threaded portion of the second combining unit 142, and an internally smooth bored support portion 146 for dropping the precise amount of the liquid crystal material 107 onto a surface of a substrate as a drop shape.

Figure 10A:
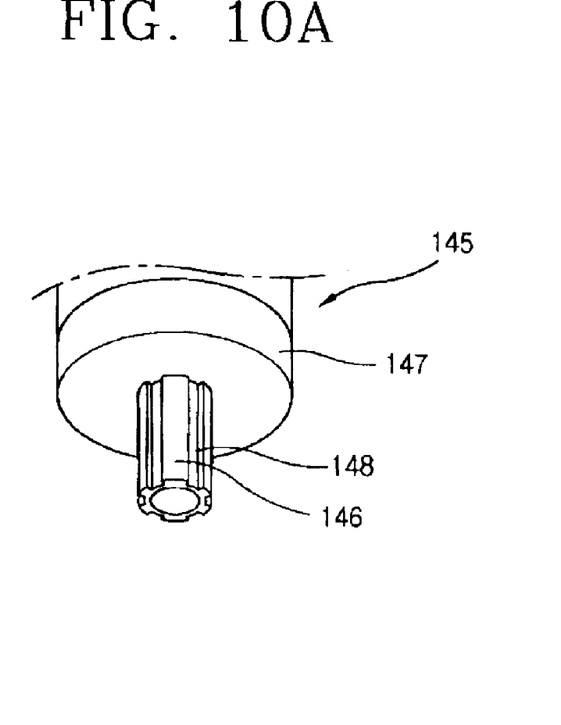
FIGS. 10A and 10B are perspective views of exemplary nozzle structures of the liquid crystal dispensing apparatus in accordance with the present invention.
Figure 10B:
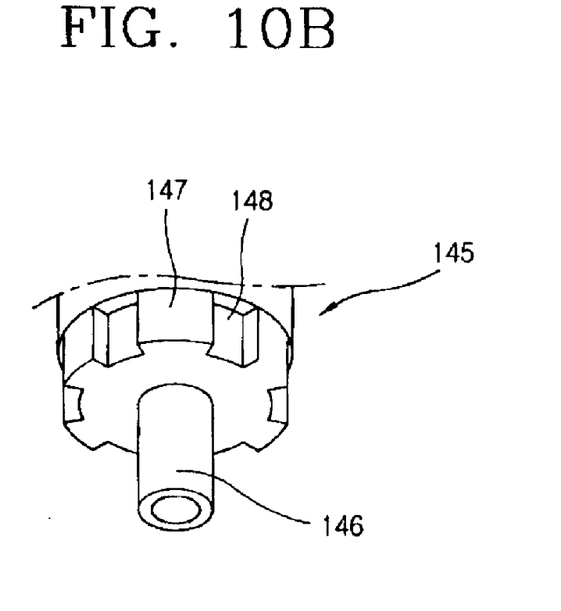

FIGS. 10A and 10B are perspective views of exemplary nozzle structures of the liquid crystal dispensing apparatus in accordance with the present invention. In FIGS. 10A and 10B, a groove 148 may be formed along an axial direction of the nozzle 145. Generally, a contact angle may be defined as an angle at which a liquid reaches thermodynamic equilibrium, and is a good indicator of solid surface wettability. Accordingly, since the nozzle 145 may be made of a metal material generally having low contact angles, metal materials have high wettability (i.e., hydrophile property) and high surface energies. Thus, liquids tend to spread out strongly onto a surface of a metal material. Thus, when liquid crystal material is dispensed through the metal nozzle 145, the liquid crystal material does not maintain a drop shape, which means having a high contact angle, at the end of the discharge hole 146 of the nozzle 145. Accordingly, the liquid crystal material spreads onto the surface of the nozzle 145 as the dispensing of the liquid crystal material is repeated. Thus, any of the liquid crystal material that spreads onto the surface of the nozzle 145 will be combined.

This liquid crystal material spreading phenomenon makes it impossible to dispense a precise amount of liquid crystal material on a surface of a substrate. For example, when an amount of the liquid crystal material discharged through the discharge hole 146 of the nozzle 145 is controlled by adjusting an opening time of the discharge hole 144 and pressure acting on the liquid crystal, part of the discharged liquid crystal material spreads out onto the surface of the nozzle 145. Accordingly, an actual amount of the liquid crystal material dispensed onto the surface of the substrate is less than an amount of the liquid crystal material discharged through the discharge hole 146. Of course, a discharge amount may be controlled when a known amount of liquid crystal spreads onto the surface of the nozzle 145, but it is impossible to compute an amount of liquid crystal material that spreads onto the surface of the nozzle 145. In addition, by repeating the liquid crystal material dispensing process, when the liquid crystal material spread onto the nozzle 145 is combined with the liquid crystal material discharged through the discharge hole 146, an amount of the liquid crystal material actually dispensed onto the surface of the substrate will be greater than a desired set amount that may be dispensed onto the surface of the substrate. Furthermore, an amount of the dispensed liquid crystal material actually dispensed onto the surface of the substrate may be irregular because of a low contact angle of the metal nozzle 145.

In order to solve these problems, as shown in FIGS. 10A and 10B, the groove 148 may be formed along an axial direction at the surface of the nozzle 145 as a set width to provide a flow pathway for the liquid crystal material 107. Although the groove 148 may be formed at the surface of the discharge hole 146 of the nozzle 145, the groove may formed at the surface of the support portion 147. During dispensing of the liquid crystal material 107, the liquid crystal material 107 spreads out onto the surface of the support portion 147. Accordingly, by forming the groove 148 at not only the surface of the discharge hole 146 but also the support portion 147, accumulation of the liquid crystal material 107 may be prevented. A width and number of groove(s) 148 may be determined according to design of the nozzle 145.

A fluorine resin layer (TEFLON®) (not shown) may be coated onto the external surfaces of the nozzle 145. Specifically, the fluorine resin layer may be coated on or in the discharge hole 146 and the supporting portion 147, and may include materials having high contact angles. Accordingly, when the fluorine resin layer is coated onto the nozzle 145, the liquid crystal material 107 discharged through the nozzle 145 does not spread out onto the surface of the nozzle 145, thereby dispensing the liquid crystal material 107 as a perfect drop shape on the surface of the substrate.

In FIGS. 7A and 7B, a needle 136 may be inserted into the liquid crystal container 124 to have an end thereof contacting the needle seat 143. In particular, the end of the needle 136 contacting the needle seat 143 may be conical such that the end is inserted into the discharge hole 144 of the needle seat 143 to block the discharge hole 144. In addition, a spring 128 maybe installed at the other end of the needle 136, and a magnetic bar 132 having an interval adjustment portion 134 may be installed above the needle 136. The magnetic bar 132 may be made of a material having strong magnetism or weak magnetism, and a cylindrical solenoid coil 130 may be installed around the magnetic bar 132. The solenoid coil 130 may be connected to a power supply system (not shown), whereby the power supply induces a magnetic field to generates a magnetic force between the solenoid coil 130 and the magnetic bar.

There is a certain interval (x) between the needle 136 and the magnetic bar 132.

When power is supplied to the solenoid coil 130 via the power supply (not shown) a magnetic force is induced to generate movement of the magnetic bar 132. Accordingly, the induced magnetic force causes contact between the magenetic bar and the needle 136. Conversely, when the power is removed from the solenoid coil 130, the elastic force of a spring 128 positioned at the end of the needle 136 causes the needle 136 to return to an initial position. Thus, up and down movement of the needle 136 causes the discharge hole 144 formed at the needle seat 143 to open and close. During dispensing of the liquid crystal material 107, the power supply is turned ON and OFF and the end of the needle 136 and the needle seat 143 make repeated contact. Accordingly, the repeated contact between the end of the needle 136 and the needle seat 143 may cause damage to both the needle 136 and the needle seat 143. Thus, it may be preferable to form the end of the needle 136 and the needle seat 143 of materials having high strength, such as hard metals, in order to prevent damage due to the repeated contact.

In FIG. 7B, by opening the discharge hole 144 (in FIG. 8) of the needle seat 143, gas ($N_2$ gas) supplied into the liquid crystal container 124 pressurizes the liquid crystal material 107. Accordingly, the liquid crystal material 107 may be dispensed from the nozzle 145. Thus, an amount of the dispensed liquid crystal material 107 may be varied according to an opening time of the discharge hole 144 and pressure acting upon the liquid crystal material 107. In addition, the opening time may be determined according to a desired interval (x) between the needle 136 and the magnetic bar 132, the magnetic force of the magnetic bar 132 generated by the solenoid coil 130, and the elastic force of the spring 128 installed at the needle 136. The magnetic force of the magnetic bar 132 may be adjusted by changing a total number of windings of the solenoid coil 130 installed around the magnetic bar 132 and a magnitude of power applied to the solenoid coil 130. In addition, the desired interval (x) between the needle 136 and the magnetic bar 132 may be adjusted by an interval adjustment portion 134 positioned at the end of the magnetic bar 132.

It will be apparent to those skilled in the art that various modifications and variations can be made in the liquid crystal dispensing apparatus according to the present invention without departing from the spirit or scope of the invention. Thus, it is intended that the present invention cover the modifications and variations of this invention provided they come within the scope of the appended claims and their equivalents.

What is claimed is:

1. A liquid crystal dispensing apparatus, comprising:
   a liquid crystal material container;
   a nozzle positioned at a lower portion of the liquid crystal container and having at least one groove formed at an exterior surface thereof; and
   a valve system for transmitting liquid crystal material from the liquid crystal material container to the nozzle by a gas pressure supplied to the liquid crystal material container.

2. The apparatus according to claim 1, wherein the valve system includes:
   a needle seat having a discharge hole for discharging the liquid crystal material from the liquid crystal material container to the nozzle;
   a needle member inserted within the liquid crystal material container to be movable along an axial direction of the liquid crystal material container; and
   a solenoid positioned to move the needle member to an uppermost axial position and to move the needle member to a lowermost axial position to contact the needle seat.

3. The apparatus according to claim 2, further comprising a spring member axially positioned on the needle member.

4. The apparatus according to claim 2, wherein the solenoid includes a magnetic bar positioned above the needle member such that the needle member is moved to the uppermost position by a removing power to the solenoid and the spring member.

5. The apparatus according to claim 1, wherein the liquid crystal material container includes metal material.

6. The apparatus according to claim 1, further including a casing for receiving the liquid crystal material container.

7. The apparatus according to claim 1, further including a combining system positioned at the lower portion of the liquid crystal material container for combining the liquid crystal material container with a needle member.

8. The apparatus according to claim 1, wherein a fluorine resin layer is formed on a surface of the nozzle.

9. The apparatus according to claim 1, wherein the groove is formed along an axial direction of the nozzle.

10. The apparatus according to claim 1, wherein the nozzle includes a discharge hole for dispensing the liquid crystal material, and a support portion at which the discharge hole is fixed.

11. The apparatus according to claim 10, wherein the groove is formed along an axial surface of the discharge hole.

12. The apparatus according to claim 10, wherein the groove is formed at a surface of the support portion.

13. The apparatus according to claim 1, further including a heating system for heating the liquid crystal material within the liquid crystal material container.

14. The apparatus of claim 13, wherein the heating system is positioned within the liquid crystal material container.

15. The apparatus according to claim 13, wherein the heating system is positioned along an exterior of the liquid crystal material container.

16. The apparatus according to claim 13, wherein the liquid crystal material has a relatively high viscosity.

17. The apparatus of claim 16, wherein the liquid crystal material includes ferroelectric liquid crystal material.

18. A liquid crystal dispensing apparatus, comprising:
    a liquid crystal material container;
    a heating system for heating liquid crystal material within the liquid crystal material container;
    a nozzle positioned at a lower portion of the liquid crystal material container for dispensing the liquid crystal material onto a surface of a substrate; and
    a valve system for controlling flow of the liquid crystal material from the liquid crystal material container to the nozzle by application of gas pressure into the liquid crystal material container.

19. The apparatus according to claim 18, wherein the liquid crystal container includes polyethylene.

20. The apparatus according to claim 19, further including a casing for receiving the liquid crystal material container.

21. The apparatus according to claim 19, wherein the heating system is positioned within the liquid crystal material container.

22. The apparatus according to claim 18, wherein the liquid crystal material container includes metal.

23. The apparatus according to claim 22, wherein the heating system is positioned within the liquid crystal material container.

24. The apparatus according to claim 21, wherein the heating system is positioned at an exterior of the liquid crystal material container.

* * * * *